United States Patent
Sze et al.

(10) Patent No.: US 6,586,834 B1
(45) Date of Patent: Jul. 1, 2003

(54) DIE-UP TAPE BALL GRID ARRAY PACKAGE

(75) Inventors: Ming Wang Sze, Tsuen Wan (HK);
Kwok Cheung Tsang, Fanling (HK);
Wing Keung Lam, KLN (HK);
Kin-wai Wong, Chai Wan (HK)

(73) Assignee: Asat Ltd., New Territories (HK)

( * ) Notice: Subject to any disclaimer, the term of this patent is extended or adjusted under 35 U.S.C. 154(b) by 0 days.

(21) Appl. No.: 10/171,694

(22) Filed: Jun. 17, 2002

(51) Int. Cl.[7] .............................................. H01L 23/34
(52) U.S. Cl. ...................... 257/712; 257/737; 257/738; 257/784; 257/786; 257/675; 257/787; 257/734; 257/717; 257/684
(58) Field of Search .............................. 257/712, 737, 257/738, 777, 784, 786, 774, 680, 675, 787, 734, 717, 720, 684

(56) References Cited

U.S. PATENT DOCUMENTS

| | | | | |
|---|---|---|---|---|
| 6,011,694 A | * | 1/2000 | Hirakawa | 361/774 |
| 6,140,707 A | * | 10/2000 | Plepys et al. | 257/778 |
| 6,153,924 A | * | 11/2000 | Kinsman | 257/666 |
| 6,246,111 B1 | * | 6/2001 | Huang et al. | 257/675 |

* cited by examiner

Primary Examiner—Nathan J. Flynn
Assistant Examiner—Pershelle Greene
(74) Attorney, Agent, or Firm—Keating & Bennett, LLP

(57) ABSTRACT

An integrated circuit package including a flexible circuit tape having a flexible polyimide tape laminated to a conductor layer, a plurality of blind holes extending through the flexible tape to the conductor layer and a plurality of through holes extending through the flexible tape and the conductor layer. A copper leadframe is fixed to the flexible circuit tape and electrically isolated from the conductor layer. The copper leadframe includes an etched down die attach pad and heat spreader portions. The die attach pad is etched down such that at least a portion of the die attach pad is reduced in thickness. The through holes in the flexible circuit tape extend through to the copper leadframe. A semiconductor die is mounted on the at least a portion of the die attach pad. Wire bonds extend from pads on the semiconductor die to the die attach pad and from other pads on the semiconductor die to the conductor layer, an encapsulating material encapsulates the semiconductor die and the wire bonds. A plurality of solder ball contacts in the through holes are fixed to the copper leadframe and a plurality of solder ball contacts in the blind holes are fixed to the conductor layer.

8 Claims, 5 Drawing Sheets

Step 1: Raw Material (Cu Panel)

Step 2: Etch Resist Coating

Step 3: UV Exposure With Phototool

Step 4: Developing

Step 5: Immersion Etching and Stripping

Step 6: Plating with Ag or Ni/Pd

DIE-UP TAPE BALL GRID ARRAY PACKAGE

FIELD OF THE INVENTION

This invention relates in general to integrated circuit packaging, and more particularly to a method of manufacture of a tape ball grid array package with improved thermal and electrical performance.

BACKGROUND OF THE INVENTION

High performance integrated circuit (IC) packages are well known in the art. Improvements in IC packages are driven by demands for increased thermal and electrical performance, decreased size and cost of manufacture.

In general, array packaging such as Plastic-Ball Grid Array packages provide a high density of interconnects relative to the surface area of the package. However typical PBGA packages include a convoluted signal path, giving rise to high impedances and an inefficient thermal path which results in low thermal dissipation performance.

Typically, array packaging such as ball grid array (BGA) packages provide for a high density package. Applicants' prior Tape Ball Grid Array (TBGA) product is an advanced IC package having straight signal paths and a copper backed, die down construction which enjoys enhanced performance over prior art PBGA packages. There are still further demands, for increased thermal and electrical performance, however.

It is an object of an aspect of the present invention to provide a method for manufacturing an IC package with improved thermal and electrical performance as well as the opportunity for a full array of interconnect balls at the backside of the package not found in a typical die down format.

SUMMARY OF THE INVENTION

In a particular aspect, the IC package of the present invention includes a flexible circuit tape. The flexible circuit tape has a flexible tape laminated to a conductor layer, a plurality of blind holes extending through the flexible tape to the conductor layer and a plurality of through holes extending through the flexible tape and the conductor layer. A copper leadframe is fixed to the flexible circuit tape and electrically isolated from the conductor layer. The copper leadframe has a die attach pad and heat spreader portions, the through holes in the flexible circuit tape extending through to the copper leadframe. A semiconductor die is mounted on the die attach pad. Wire bonds extend from pads on the semiconductor die to the die attach pad and from other pads on the semiconductor die to the conductor layer. An encapsulating material encapsulates the semiconductor die and the wire bonds.

In another aspect of the present invention, the IC package includes a flexible circuit tape. The flexible circuit tape has a flexible polyimide tape laminated to a conductor layer, a plurality of blind holes extending through the flexible tape to the conductor layer and a plurality of through holes extending through the flexible tape and the conductor layer. A copper leadframe is fixed to the flexible circuit tape and electrically isolated from the conductor layer. The copper leadframe includes an etched down die attach pad and heat spreader portions. The die attach pad is etched down such that at least a portion of the die attach pad is reduced in thickness. The through holes in the flexible circuit tape extend through to the copper leadframe. A semiconductor die is mounted on the at least a portion of the die attach pad. Wire bonds extend from pads on the semiconductor die to the die attach pad and from other pads on the semiconductor die to the conductor layer. An encapsulating material encapsulates the semiconductor die and the wire bonds. A plurality of solder ball contacts in the through holes are fixed to the copper leadframe and a plurality of solder ball contacts in the blind holes are fixed to the conductor layer.

In another aspect of the present invention, the IC package is manufactured by: providing a flexible circuit tape having a flexible polyimide tape laminated to a conductor layer, a plurality of blind holes extending through the flexible tape to the conductor layer and a plurality of through holes extending through the flexible tape and the conductor layer; fixing a copper leadframe to the flexible circuit tape and electrically isolating the copper leadframe from the conductor layer, the copper leadframe including an etched down die attach pad and heat spreader portions, the die attach pad being etched down such that at least a portion of the die attach pad is reduced in thickness, the through holes in the flexible circuit tape extending through to the copper leadframe; mounting a semiconductor die on the at least a portion of the die attach pad; wire bonding from pads on the semiconductor die to the die attach pad and from other pads on the semiconductor die to the conductor layer; encapsulating the semiconductor die and the wire bonds; fixing a plurality of solder ball contacts in the through holes, to the copper leadframe; and fixing a plurality of solder ball contacts in the blind holes, to the conductor.

In one aspect of the present invention, solder balls are directly soldered to portions of the leadframe. Advantageously, the solder balls have a low impedance on ground. Further, this provides an extra thermal path from the leadframe to the motherboard, for thermal dissipation. Also, it is an advantage of an aspect of the present invention that the semiconductor die sits in a portion of the die attach pad that is reduced in thickness and therefore the length of the wire bonds (both to the die attach pad (ground bonds) and to the bond fingers (I/O bonds) can be reduced. Because electrical impedance in an IC package is directly related to the wire length, this construction allows for a package suitable to operate at higher frequencies.

A further advantage of an aspect of the present invention is provided by the three dimensional nature of the partial etch die attach pad. This pad provides additional exposed metal for the mold compound to adhere to, thereby providing a more robust package.

Still further, it is an advantage of an aspect of the present invention that the die and wire bonds are lower in the profile of the package. This allows the option of reducing the package profile.

BRIEF DESCRIPTION OF THE DRAWINGS

The present invention will be better understood with reference to the following drawings wherein like numerals refer to like parts throughout, and in which.

DETAILED DESCRIPTION OF THE PREFERRED EMBODIMENTS

The present invention is an improvement over applicant's own tab grid array packages as described in issued U.S. Pat. Nos. 5,397,921, 5,409,865, and 5,843,808, all of which are assigned to the assignee of the present invention, the contents of which are incorporated herein by reference.

Figure 1A:
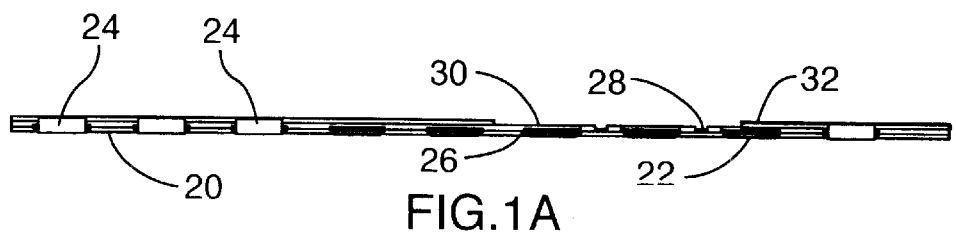
FIGS. 1A to 1E show processing steps for manufacturing a tape ball grid array package with etch-down die attach pad according to an embodiment of the present invention.
Figure 1B:
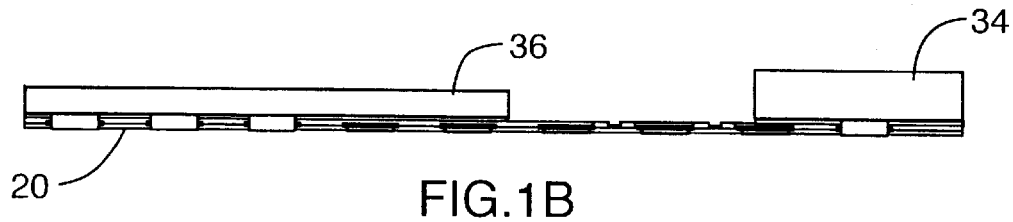

Referring to FIGS. 1A to 1E, process steps are shown for the manufacture of a ball grid array package in accordance with an embodiment of the present invention. Referring first to FIG. 1A, a flexible circuit tape 20 is shown. The flexible circuit tape 20 includes a signal trace and pad layer, also referred to herein as a conductor layer, laminated to a polyimide tape. In the present embodiment, the flexible circuit tape includes copper laminated to a polyimide tape.

A plurality of blind holes 22 extend through the polyimide tape and a plurality of through holes 24 located around the blind holes, are punched through the polyimide and through the conductive layer of the flexible circuit tape 20. The function of the blind holes 22 and the through holes 24 will be described further below. The blind holes 22 are located to coincide with conductive ball pads 26 in the conductive layer of the flexible circuit tape 20. Bonding sites, referred to herein as bond fingers 28, are part of the copper conductive layer and form electrical paths to the ball pads 26 for wire bonding.

A solder mask 30 covers the flexible circuit tape 20, including the ball pads 26 with the exception of the through holes 24 and the bond fingers 28 which are used for wire bonding. The solder mask 30 is an electrical insulator for electrically isolating the conductor layer and the adhesive film used to bond the tape to the leadframe.

A tape adhesive 32 is selectively added to the above-described flexible circuit tape 20 for attaching a copper leadframe 40. The copper leadframe 40 is selectively etched using known etching techniques, as would be understood by those skilled in the art, to form the half etched or etched down die attach pad 36 and the heat spreader 34. Thus, the copper leadframe comprises the heat spreader 34 and the half etched die attach pad 36. The heat spreader 34 and die attach pad 36 provide support and serve to stiffen the flexible circuit tape 20.

Figure 2A:
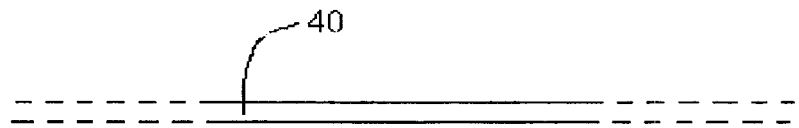
FIGS. 2A to 2F show the processing steps for selectively etching a copper leadframe in accordance with aspect of an embodiment of the present invention.
Figure 2B:
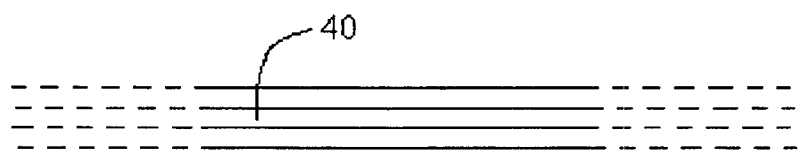

The selective etching process will now be described with reference to the elevation view of FIG. 2A which shows a portion of a Cu (copper) panel substrate which forms the raw material of the leadframe strip 40. An upper and a lower surface of the leadframe strip 40 is coated with a layer of photo-imageable etch resist such as a photo-imageable epoxy (FIG. 2B). The photo-imageable etch resist is spin coated on the leadframe strip 40.

Figure 2C:
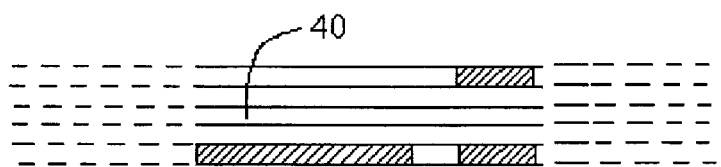
Figure 2D:
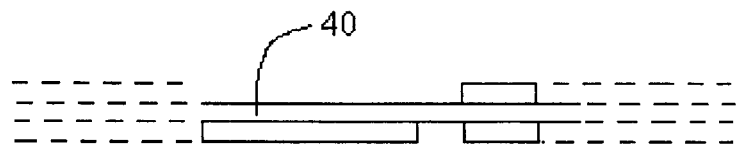

Next, the layer of photo-imageable etch resist is imaged with a photo-tool. This is accomplished by exposure of the etch resist to ultraviolet light while being masked by the photo-tool, as shown in FIG. 2C, and subsequent developing of the etch resist, as shown in FIG. 2D. The etch resist is thereby patterned to provide pits on both the upper and the lower surfaces of the leadframe strip 40, in which the Cu substrate is exposed.

Figure 2E:
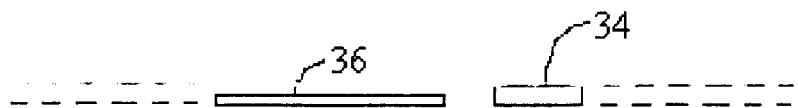

The leadframe strip 40 is then immersion etched in order to etch both the top and bottom surfaces, following which, the etch resist is stripped away using conventional means. The resulting pattern of heat spreader 34 and etched down die attach pad 36 is shown in FIG. 2E. The thickness of the die attach pad 36 is less than the thickness of the heat spreader 34. This results from the pattern of developed etch resist and subsequent etching as shown in FIGS. 2D and 2E, respectively. Note that at the die attach pad 36, only the top surface of the leadframe strip 40 is exposed to the etchant upon immersion as the bottom surface is masked by the etch resist.

Figure 2F:

Next, the leadframe strip 40 is plated with silver (Ag) or nickel/palladium (Ni/Pd) to facilitate wire bonding (FIG. 2F).

Referring again to FIG. 1B, the heat spreader 34 and die attach pad 36 are then adhered to the tape adhesive 32.

Figure 1C:
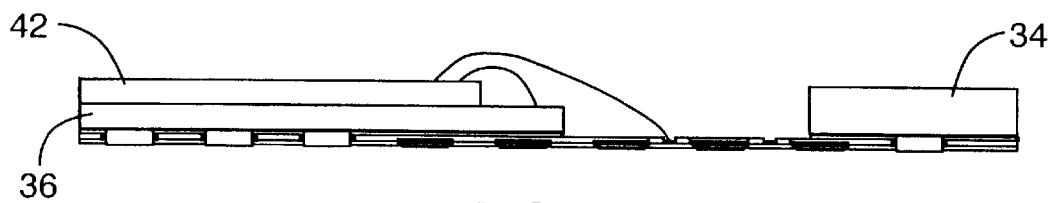

Referring now to FIG. 1C, the semiconductor die 42 is then added using known die attach techniques. In the present embodiment, the semiconductor die 42 is attached using silver filled epoxy adhesive.

Gold wires are then bonded between pads of the semiconductor die 42 and the die attach pad 36 and between other pads of the semiconductor die 42 and the bond fingers 28. As stated herein above, the bond fingers 28 form an electrical path between the ball pads and the gold wire bonding.

The blind holes 22 serve as points of connection between the conductive ball pads and the solder ball contacts to be added later. The through holes 24 serve as connections between the die attach pad 36 and the solder ball contacts and between the heat spreader 34 and the solder ball contacts to be added later.

Figure 1D:
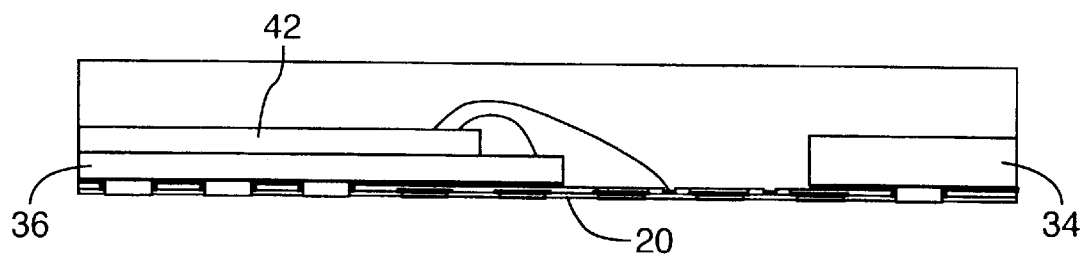

Next the package is encapsulated in an overmold compound 44, as best shown in FIG. 1D. The encapsulation material protects the wire bonds as well as the semiconductor die 42.

Figure 1E:
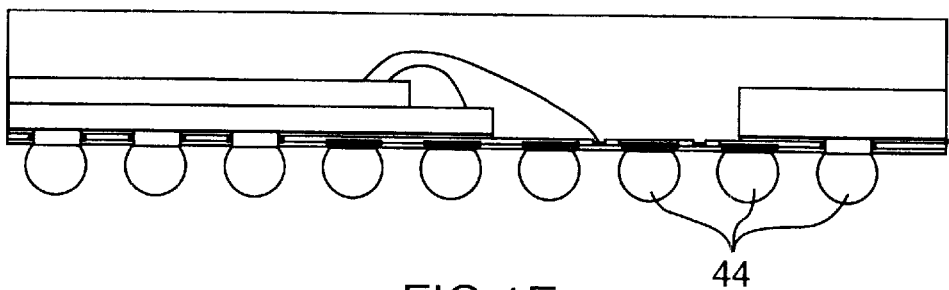

Referring now to FIG. 1E, solder balls 44 are then placed in the blind holes and attached to the ball pads 26. Solder balls 44 are also placed in the through holes and attached to the heat spreader 34 and the half etched die attach pad 36. To attach the solder balls, a flux is added to the balls prior to placement and, after placement the solder balls are reflowed using known reflow techniques. The solder balls 44 on the ball pads 26 provide signal and power connections from the solder balls 44 through the bond fingers 28, through the wire bonds and to corresponding pads of the semiconductor die 42. Conversely, the solder balls 44 in the through holes are in contact with the heat spreader 34 and the die attach pad 36 to provide a ground connection and a thermal pathway.

Next, excess flux is removed by cleaning with an appropriate cleaner and finally, the packages are singulated using either a saw or punch technique.

Figure 3:
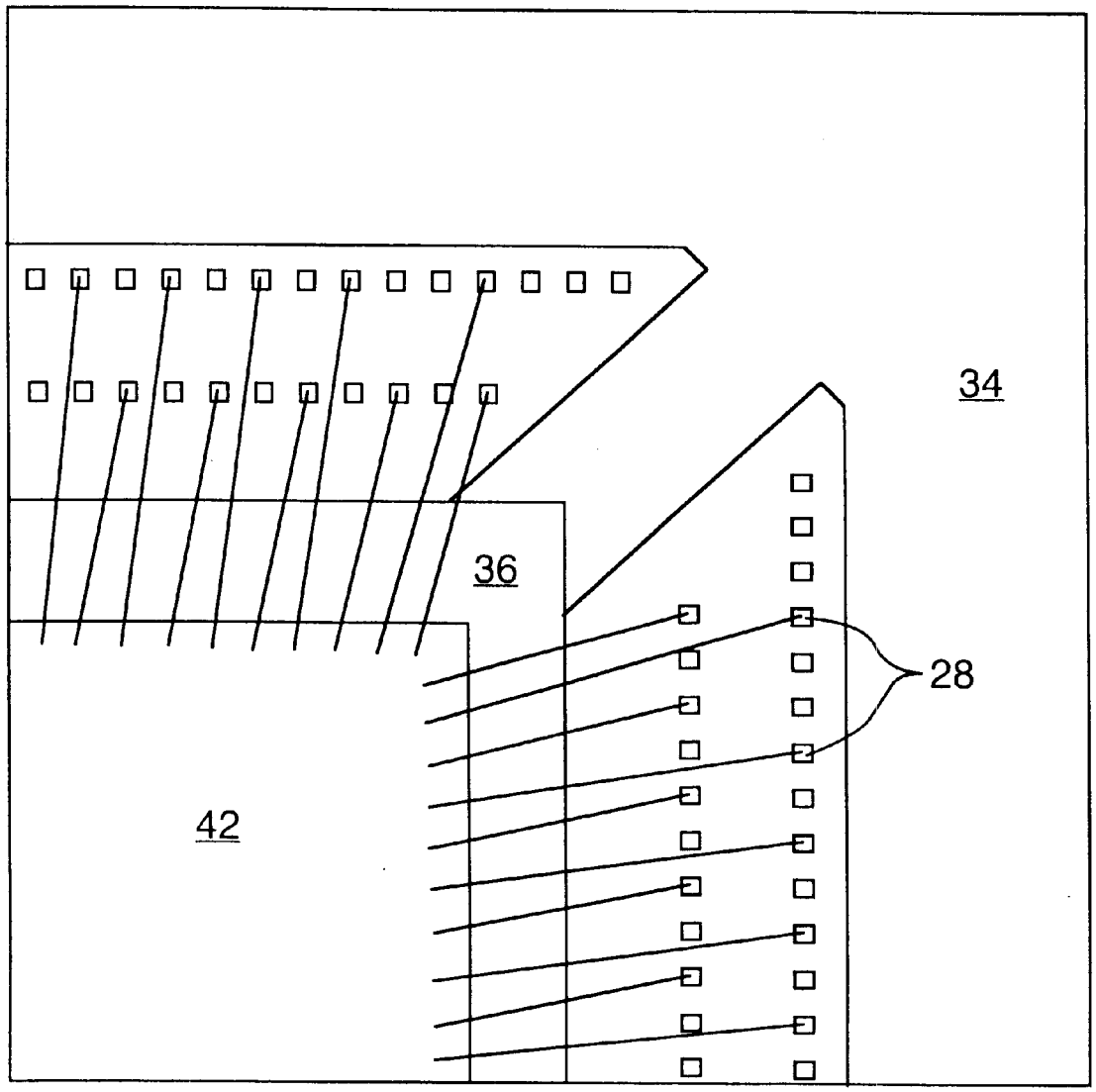
FIG. 3 shows a top view of a portion of the tape ball grid array package of the embodiment of FIG. 1.

FIG. 3 shows a top view of a portion of an assembled package in accordance with the embodiment of FIGS. 1A to 1E of the present invention.

Figure 4A:
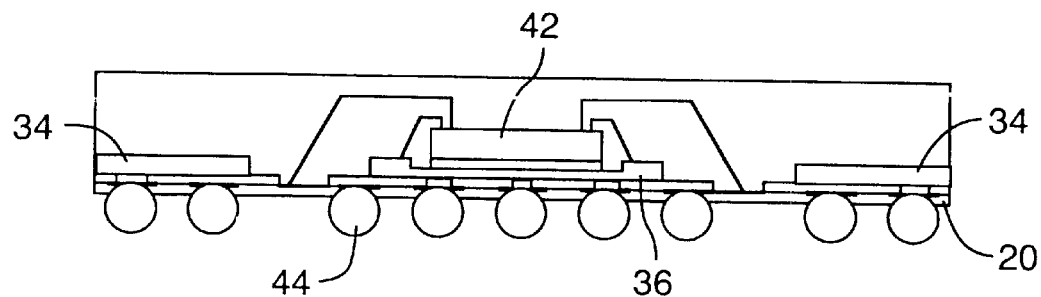
FIGS. 4A and 4B show a cross sectional side view and a top view, respectively of an alternative embodiment of the present invention.
Figure 4B:
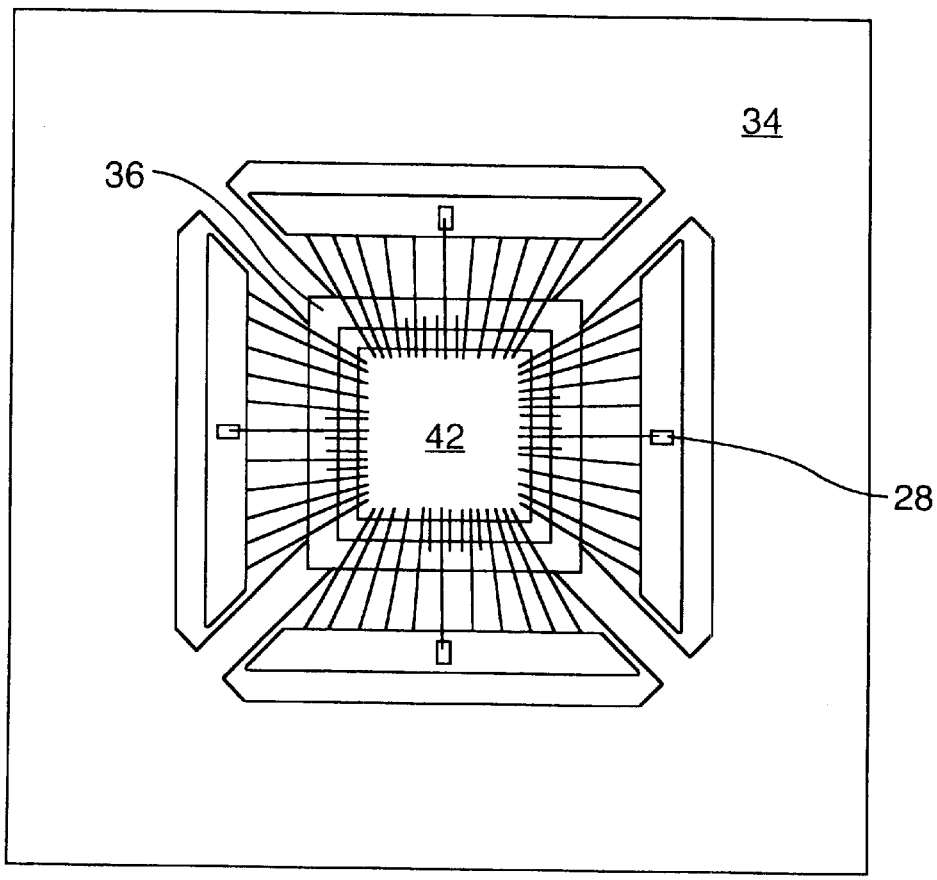

FIGS. 4A and 4B show a cross sectional side view and a top view, respectively of an alternative embodiment of the present invention. In this embodiment, only part of the die attach pad 36 is etched down to provide a pocket in which the semiconductor die 42 is mounted using silver filled epoxy.

Specific embodiments of the present invention have been shown and described herein. However, modifications and variations to this embodiment are possible. For example, rather than an overmold compound being used as an encapsulating material, a globtop material can be used, as would be understood by those skilled in the art Those skilled in the art will conceive of still other modifications and variations, all of which are within the scope and sphere of the present invention.

What is claimed is:

1. An integrated circuit package comprising:
   a flexible circuit tape having a flexible tape laminated to a conductor layer, a plurality of blind holes extending through said flexible tape to said conductor layer and a plurality of through holes extending through said flexible tape and said conductor layer;
   a die attach pad fixed to a portion of said flexible circuit tape and electrically isolated from said conductor layer;
   a heat spreader fixed to another portion of said flexible circuit tape and electrically isolated from said conductor layer, each of said through holes in said flexible circuit tape extending through said flexible circuit tape to at least one of said die attach pad and said heat spreader;
   a semiconductor die mounted on said die attach pad;
   wire bonds from pads on said semiconductor die to said die attach pad and from other pads on said semiconductor die to said conductor layer;
   an encapsulating material encapsulating said semiconductor die and said wire bonds;
   a plurality of solder ball contacts in said through holes, each of said plurality of solder ball contacts in said through holes fixed to one of said die attach pad and said heat spreader; and
   a plurality of solder ball contacts in said blind holes, fixed to said conductor layer.

2. The integrated circuit package according to claim 1 wherein at least a portion of said die attach pad is etched down to reduce the thickness of said portion of said die attach pad.

3. The integrated circuit package according to claim 1 wherein a copper leadframe comprises said die attach pad and said heat spreader.

4. The integrated circuit package according to claim 1 wherein said flexible circuit tape comprises a copper signal trace and pad layer laminated to a polyimide material.

5. The integrated circuit package according to claim 3 wherein said copper leadframe is electrically isolated from said conductor layer by a solder mask applied across said tape except at wire bond sites and at said through holes.

6. The integrated circuit package according to claim 1 wherein said bond sites include bond fingers from said conductor layer.

7. An integrated circuit package comprising:
   a flexible circuit tape having a flexible polyimide tape laminated to a conductor layer, a plurality of blind holes extending through said flexible tape to said conductor layer and a plurality of through holes extending through said flexible tape and said conductor layer;
   a copper leadframe fixed to said flexible circuit tape and electrically isolated from said conductor layer, said copper leadframe including an etched down die attach pad and heat spreader portions, said die attach pad being etched down such that at least a portion of said die attach pad is reduced in thickness, said through holes in said flexible circuit tape extending through to said copper leadframe;
   a semiconductor die mounted on said at least a portion of said die attach pad;
   wire bonds from pads on said semiconductor die to said die attach pad and from other pads on said semiconductor die to said conductor layer;
   an encapsulating material encapsulating said semiconductor die and said wire bonds;
   a plurality of solder ball contacts in said through holes, fixed to said copper leadframe; and
   a plurality of solder ball contacts in said blind holes, fixed to said conductor.

8. A method of manufacturing an integrated circuit package comprising:
   providing a flexible circuit tape having a flexible polyimide tape laminated to a conductor layer, a plurality of blind holes extending through said flexible tape to said conductor layer and a plurality of through holes extending through said flexible tape and said conductor layer;
   fixing a copper leadframe to said flexible circuit tape and electrically isolating said copper leadframe from said conductor layer, said copper leadframe including an etched down die attach pad and heat spreader portions, said die attach pad being etched down such that at least a portion of said die attach pad is reduced in thickness, said through holes in said flexible circuit tape extending through to said copper leadframe;
   mounting a semiconductor die on said at least a portion of said die attach pad;
   wire bonding from pads on said semiconductor die to said die attach pad and from other pads on said semiconductor die to said conductor layer;
   encapsulating said semiconductor die and said wire bonds;
   fixing a plurality of solder ball contacts in said through holes, to said copper leadframe; and
   fixing a plurality of solder ball contacts in said blind holes, to said conductor.

* * * * *